(12) United States Patent
Hong et al.

(10) Patent No.: US 9,600,111 B2
(45) Date of Patent: Mar. 21, 2017

(54) DISPLAY DEVICE

(71) Applicant: Samsung Display Co., Ltd., Yongin, Gyeonggi-Do (KR)

(72) Inventors: Sang-Min Hong, Yongin (KR); Hyun-Min Hwang, Yongin (KR); Go-Eun Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 273 days.

(21) Appl. No.: 14/334,999

(22) Filed: Jul. 18, 2014

(65) Prior Publication Data

US 2015/0261365 A1   Sep. 17, 2015

(30) Foreign Application Priority Data

Mar. 17, 2014 (KR) .................. 10-2014-0031164

(51) Int. Cl.
  *G06F 3/045*   (2006.01)
  *G06F 3/041*   (2006.01)
  *H01L 27/32*   (2006.01)
  *H01L 51/52*   (2006.01)

(52) U.S. Cl.
  CPC .......... *G06F 3/0412* (2013.01); *H01L 27/323* (2013.01); *H01L 27/3244* (2013.01); *H01L 51/5246* (2013.01)

(58) Field of Classification Search
  CPC .... G06F 3/0411; G06F 3/0412; G06F 3/0414; G06F 3/0416; G06F 3/043; G06F 3/046; G06F 3/03547; G06F 2203/0411; H01L 51/5246; H01L 27/3244; H01L 27/323
  USPC .................................. 345/173–179
  See application file for complete search history.

(56) References Cited

U.S. PATENT DOCUMENTS

| 7,190,430 | B2 * | 3/2007 | Miyazaki | ............. G02F 1/1339 349/150 |
| 8,302,300 | B2 * | 11/2012 | Chen | .................... H05K 3/0008 29/830 |
| 8,466,854 | B2 * | 6/2013 | Liu | ........................ G06F 3/0412 345/204 |
| 2003/0147040 | A1 | 8/2003 | Park et al. | |
| 2010/0044692 | A1 | 2/2010 | Kim et al. | |
| 2010/0186449 | A1 | 7/2010 | Aitken et al. | |
| 2013/0001533 | A1 | 1/2013 | Kim et al. | |

FOREIGN PATENT DOCUMENTS

| JP | 2003-280003 A | 10/2003 |
| JP | 2003-317934 A | 11/2003 |
| JP | 2010-102066 A | 5/2010 |
| KR | 2003-0066887 A | 8/2003 |
| KR | 10-2003-0096653 A | 12/2003 |

(Continued)

*Primary Examiner* — Vijay Shankar (57) ABSTRACT

A display device includes: a substrate on which a display unit is formed and an encapsulation unit for sealing the substrate; a touch screen panel formed on the encapsulation unit; a window cover provided on the touch screen panel; an alignment key for aligning positions of the display panel and the window cover; and a sealing portion disposed between the substrate and encapsulation unit. An area expansion portion is formed in a position of the sealing portion corresponding to the alignment key.

20 Claims, 5 Drawing Sheets

(56) References Cited

FOREIGN PATENT DOCUMENTS

| | | |
|---|---|---|
| KR | 10-2010-0022738 A | 3/2010 |
| KR | 10-2012-0088842 A | 8/2012 |
| KR | 10-2013-0007006 A | 1/2013 |

\* cited by examiner

DISPLAY DEVICE

CLAIM OF PRIORITY

This application claims the benefit of Korean Patent Application No. 10-2014-0031164, filed on Mar. 17, 2014, in the Korean Intellectual Property Office, the disclosure of which is incorporated herein in its entirety by reference.

BACKGROUND OF THE INVENTION

Field of the Invention

The present invention relates to a display device including a sealing portion with enhanced bonding reliability.

Description of the Related Art

In general, a display device, such as an organic light-emitting display device including a thin film transistor (TFT), has been spotlighted because the display device can be variously applied to mobile display devices such as smartphones, tablet personal computers (PCs), ultra-thin laptops, digital cameras, camcorders, and personal digital assistants (PDAs), or to electric/electronic products such as ultra-thin TVs.

A display device, such as an organic light-emitting display device, needs to seal substrates in order to protect a display unit that forms an image. A sealing portion is formed between a plurality of substrates, and predetermined energy is applied to the sealing portion, and thus the plurality of substrates are bonded to each other. After sealing is complete, it is necessary to maintain a structural strength of the sealing portion.

SUMMARY OF THE INVENTION

One or more embodiments of the present invention comprise a display device including a sealing portion with enhanced structural rigidity.

Additional aspects will be set forth in part in the description which follows and, in part, will be apparent from the description, or may be learned by practice of the presented embodiments.

According to one or more embodiments of the present invention, a display device comprises: a display panel including a substrate on which a display unit is formed and an encapsulation unit for sealing the substrate; a touch screen panel formed on the encapsulation unit; a window cover provided on the touch screen panel; an alignment key for aligning positions of the display panel and the window cover; and a sealing portion disposed between the substrate and the encapsulation unit; wherein an area expansion portion is formed in a position of the sealing portion corresponding to the alignment key.

The alignment key may be formed on a position of the encapsulation unit corresponding to the sealing portion in a direction perpendicular to a direction in which the display panel is disposed.

The sealing portion and the alignment key may overlap with each other, and the area expansion portion is formed by expanding an area of the sealing portion in a portion that overlaps with the alignment key.

The area expansion portion may be formed by expanding a width of the sealing portion in the portion that overlaps with the alignment key so as to be greater than a width of the sealing portion in another portion that does not overlap with the alignment key.

The area expansion portion may be formed so as to have a size corresponding to a contraction area of the sealing portion in the portion that overlaps with the alignment key after performing laser sealing.

The sealing portion may extend in a direction of the display panel, and area expansion portions extend from both edges of the sealing portion in a width direction of the sealing portion in the portion that overlaps with the alignment key.

The area expansion portions formed in both edges of the sealing portion may be asymmetrical with respect to each other.

The sealing portion may include a first portion extending from a position adjacent to the display unit in a direction of the display panel, and a second portion extending from the first portion in a width direction thereof and extending from the outside of the display panel in a direction of the display panel, wherein the alignment key is provided on the first portion, wherein the area expansion portion includes a first area expansion portion protruding from the first portion and a second area expansion portion protruding from the second portion, and wherein the first area expansion portion and the second area expansion portion have different sizes.

The first portion and the second portion may be integrally formed as one line.

An area of the first area expansion portion may be greater than an area of the second area expansion portion.

The first area expansion portion and the second area expansion portion may be semicircles.

The area expansion portion may be integrally formed with the sealing portion.

The sealing portion may extend by changing a path in corner portions of the display panel, and an area of the sealing portion may further expand in the corner portions.

The sealing portion may be a consecutive line formed along edges of the display panel.

A plurality of the alignment keys and a plurality of the area expansion portions may be formed in corners of the display panel.

The touch screen panel may include a plurality of electrode pattern units formed on the encapsulation unit and at least one insulating layer that separates the plurality of electrode pattern units from each other, wherein the alignment key is formed on the same surface as a surface of the encapsulation unit in which a touch screen panel wiring electrically connected to the plurality of electrode pattern units is formed.

The substrate may include an active region in which the display unit is formed, a circuit region extending to the outside of the active region, and a sealing region extending to the outside of the circuit region and in which the sealing portion is formed, wherein the touch screen panel wiring is formed on the encapsulation unit corresponding to the circuit region, and wherein the alignment key is formed on the encapsulation unit corresponding to the sealing region.

The alignment key may be formed of a conductive material.

The display unit may include: a thin film transistor (TFT); and an organic light-emitting diode (OLED) electrically connected to the TFT, and including an intermediate layer including a first electrode, a second electrode, and an emissive layer formed between the first electrode and the second electrode.

The sealing portion may include a glass frit.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE INVENTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that, when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Figure 1:
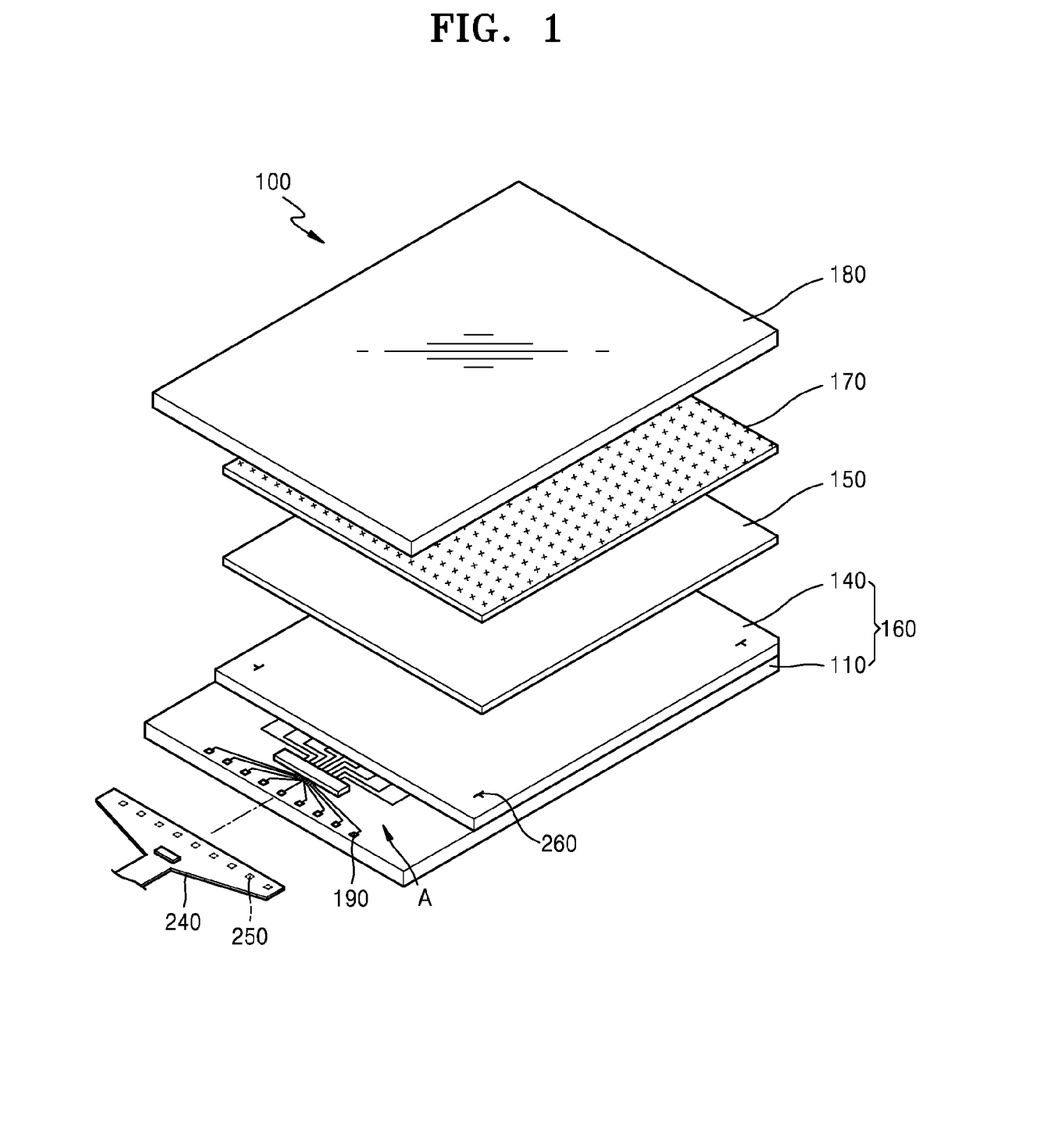
FIG. 1 is an exploded perspective view of a display device according to an embodiment of the present invention.
Figure 2:
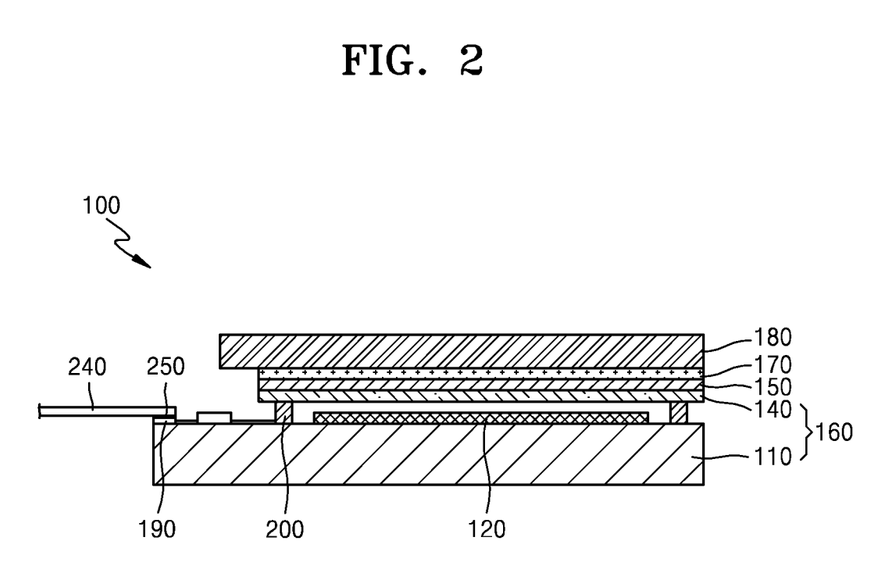
FIG. 2 is a cross-sectional view of the display device of FIG. 1.

FIG. 1 is an exploded perspective view of a display device according to an embodiment of the present invention, and FIG. 2 is a cross-sectional view of the display device of FIG. 1.

In the present embodiment, the display device 100 is an organic light emitting display device (OLED). However, the display device 100 is not limited thereto and may be one of display devices that form images with applied power, for example, a liquid crystal display device (LCD), a field emission display device (FED), and an electronic paper display device (EPD).

Referring to FIGS. 1 and 2, the display device 100 includes a display panel 160 which includes a substrate 110 and an encapsulation portion 140 provided on the substrate 110. A display unit 120 which forms an image is formed on the substrate 110.

The substrate 110 may be a glass substrate having rigidity, a polymer substrate, a film having flexibility, a metal substrate, or a combination thereof.

The encapsulation portion 140 may be a glass substrate, polymer resin substrate, or a flexible film. The encapsulation portion 140 may be formed by alternately stacking an organic layer and an inorganic layer.

A sealing portion 200 is formed on a surface on which the substrate 110 and the encapsulation portion 140 face each other so as to seal an area on which the display unit 120 is formed. The sealing portion 200 is formed along the edges of the substrate 110 and the encapsulation portion 140. The sealing portion 200 includes a glass frit.

A touch screen panel 150 is formed on the encapsulation portion 140. The touch screen panel 150 may be an on-cell touch screen panel (TSP) formed by forming a touch screen pattern on the encapsulation portion 140. The touch screen panel 150 may be integrally formed on the encapsulation portion 140 but is not limited thereto.

A polarization substrate 170 is formed on the touch screen panel 150. The polarization substrate 170 prevents external light from being reflected from the display unit 120.

A window cover 180 is provided on the polarization substrate 170 in order to protect the display device 100. The window cover 180 includes glass having rigidity.

An alignment key 260 is formed on the encapsulation portion 140. The alignment key 260 is a mark formed by combining the display panel 120 and the window cover 180 at a right position.

An area A that is exposed by extending from an edge of the encapsulation portion 140 is formed on the substrate 110. A plurality of pads 190 are spaced apart from each other and arranged on the exposed area A of the substrate 110 in one direction of the substrate 110.

Terminals 250 of a circuit board 240 are respectively electrically connected to the pads 190 to receive a signal from the outside. The circuit board 240 may be a flexible printed circuit board (FPCB) having flexibility.

Figure 3:
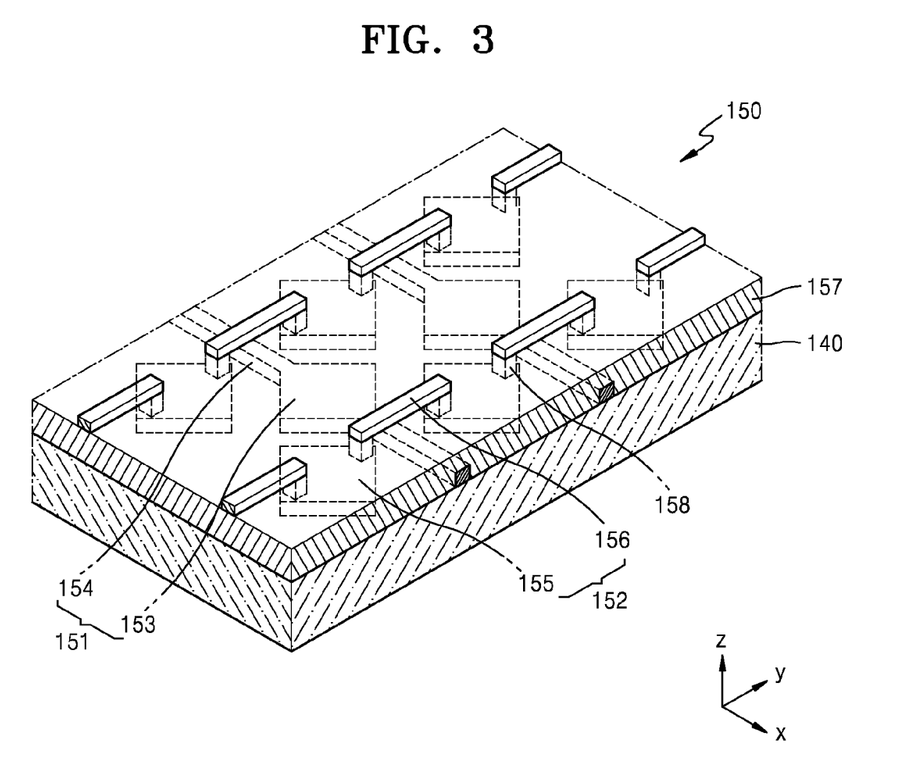
FIG. 3 illustrates a touch screen panel of FIG. 1.

FIG. 3 illustrates the touch screen panel of FIG. 1.

In the present embodiment, the touch screen panel 150 is an electrostatic capacitive type touch screen panel but is not necessarily limited thereto. The touch screen panel 150 may be one selected from the group consisting of a resistive type touch screen panel, an electro-magnetic type touch screen panel, a saw type touch screen panel, and an infrared type touch screen panel.

Referring to FIG. 3, the touch screen panel 150 is formed on the encapsulation portion 140. Although the touch screen panel 150 is integrally formed on the encapsulation substrate 140 in the present embodiment, the touch screen panel 150 may be formed on a separate substrate.

A plurality of first electrode pattern portions 151 and a plurality of second electrode pattern portions 152 may be alternately arranged on the encapsulation substrate 140.

The first electrode pattern portions 151 are formed to face corners of each other in a first direction (X direction) of the encapsulation substrate 140. The first electrode pattern portions 151 include a plurality of first main body portions 153 and a plurality of first connection portions 154 that electrically connect the first main body portions 153.

The first main body portions 153 are formed in a diamond shape. The first main body portions 153 are formed in a line in the first direction (X direction) of the encapsulation substrate 140. Each of the first connection portions 154 is formed between a pair of the first main body portions 153 that are arranged adjacent to each other in the first direction (X direction). Each of the first connection portions 154 connects the pair of first main body portions 153 to each other.

The second electrode pattern portions 152 are disposed between a pair of adjacent first electrode pattern portions 151. The second electrode pattern portions 152 are formed so as to face corners of each other in a second direction (Y direction) of the encapsulation substrate 140. The second electrode pattern portions 152 include a plurality of second main body portions 155 and a plurality of second connection portions 156 that electrically connect the second main body portions 155.

The second main body portions 155 are formed in a diamond shape. The second main body portions 155 are formed in a line in the second direction (Y direction) of the encapsulation substrate 140. Each of the second connection portions 156 connects a pair of the second main body portions 155 to each other.

In this regard, the pair of adjacent first main body portions 153 are connected to each other by the first connection portions 154 disposed on the same plane as the first main body portions 153. A pair of the second main body portions 155 adjacent to each other are connected to each other by the second connection portions 156 disposed on a plane that is different from the plane where first connection portions 154 are disposed in order to avoid interference between the second electrode pattern portions 152 and the first electrode pattern portions 151.

An insulation layer 157 that covers both the first electrode pattern portions 151 and the second electrode pattern portions 152 is formed on the encapsulation substrate 140. The insulation layer 157 insulates the first electrode pattern portions 151 and the second electrode pattern portions 152 from each other.

A plurality of contact holes 158 are formed in the insulation layer 157. The contact holes 158 are formed in areas of the insulation layer 157 that correspond to facing corners of the pair of adjacent second main body portions 155. The contact holes 158 are formed in areas of the insulation layer 157 in which the first electrode pattern portions 151 and the second electrode pattern portions 152 cross each other.

The second connection portions 156 are arranged across the insulation layer 157. Both ends of each of the second connection portions 156 vertically extend and are buried in the contact holes 158. Both ends of each of the second connection portions 156 contact upper surfaces of the second main body portions 155. Accordingly, the second connection portions 156 electrically connect the pair of adjacent second electrode pattern portions 152 to each other.

The first electrode pattern portions 151 and the second electrode pattern portions 152 may be formed by photolithography. For example, the first electrode pattern portions 151 and the second electrode pattern portions 152 may be formed by patterning a transparent conductive layer formed by using manufacturing methods, such as deposition, spin coating, sputtering, inkjet, or the like. The first electrode pattern portions 151 and the second electrode pattern portions 152 are formed of a transparent conductive layer, for example, a transparent material such as an indium tin oxide (ITO), an indium zinc oxide (IZO), a zinc oxide (ZnO), or an indium oxide ($In_2O_3$).

A protection layer (not shown) for covering the second connection portions 156 that connect the second electrode pattern portions 152 may be further formed on the insulation layer 157.

If an input unit, such as a finger, approaches or contacts the encapsulation substrate 140, the touch screen panel 150 measures electrostatic capacitance that changes between the first electrode pattern portions 151 and the second electrode pattern portions 152 and detects a touch location.

The display device 100 having the above-described structure may implement a function of a touch panel without increasing a thickness thereof. The display device 100 uses a touch method of an on-cell TSP in which the touch screen panel 150 is provided on an outer surface of the encapsulation substrate 140, and thus an amount of reflection may be reduced even when external light is strong, thereby forming a clear image.

Figure 4:
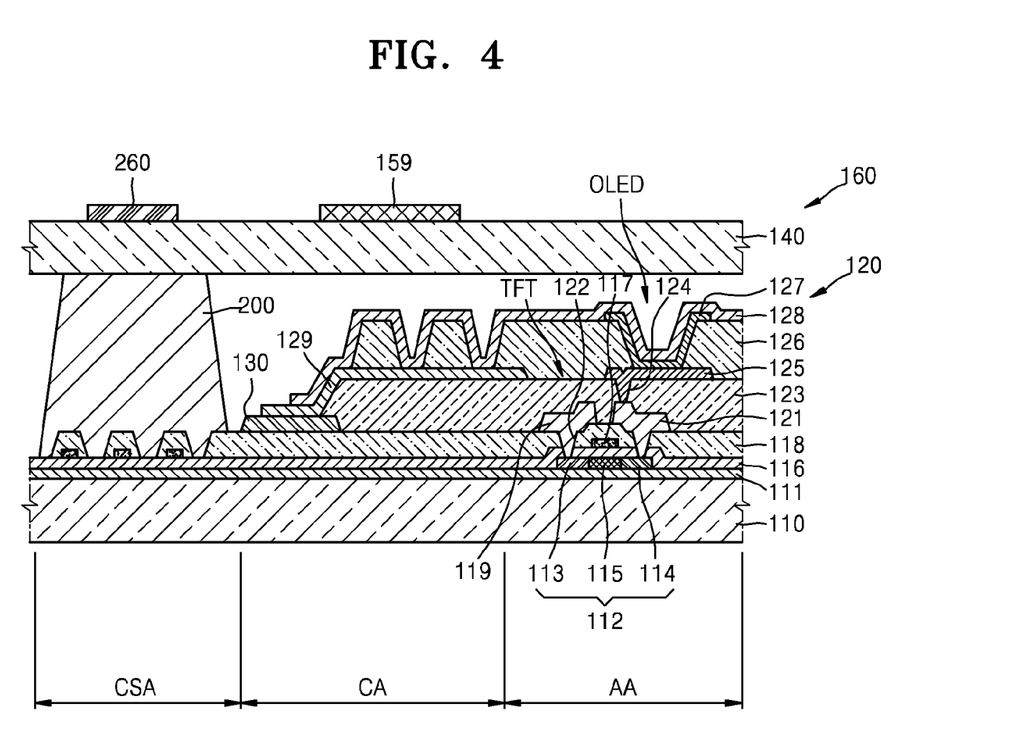
FIG. 4 is a cross-sectional view of a part of a display panel of FIG. 1.

FIG. 4 is a cross-sectional view of a part of the display panel of FIG. 1.

Referring to FIG. 4, in the display panel 160, an active area AA in which the display unit 120 is formed, a circuit area CA extending to the outside of the active area AA, and a cell seal area CSA extending to the outside of the circuit area CA are formed on the substrate 110.

The active area AA includes an area in which pixels are formed, an area in which transistors are formed, and an area in which capacitors are formed. The circuit area CA includes an area in which a circuit pattern for electrically transmitting a signal to the display active area AA is formed. The cell seal area CSA includes an area in which the sealing portion 200 is formed.

The substrate 110 may be a glass substrate, a polymer substrate, a flexible film, a metal substrate, or a combination thereof. The substrate 110 may be transparent, opaque, or semi-transparent.

A barrier layer 111 is formed on the substrate 110. The barrier layer 111 provides a flat surface on the substrate 110 and prevents impure elements from permeating into the substrate 110. The barrier layer 111 has a structure in which organic layers, inorganic layers, or an organic layer and an inorganic layer are alternately stacked.

A semiconductor active layer 112 is formed on the barrier layer 111. The semiconductor active layer 112 may be formed of polycrystal silicon but is not necessarily limited thereto, and may be formed of a semiconductor oxide.

For example, the oxide semiconductor may include an oxide of a material selected from the group consisting of Group 4, 12, 13, and 14 metal elements, such as zinc (Zn), indium (In), gallium (Ga), stannum (Sn), cadmium (Cd), germanium (Ge), and hafnium (Hf), and a combination thereof.

The semiconductor active layer 112 includes a source region 113 and a drain region 114 which are formed by doping N-type impurity ions or P-type impurity ions. A channel region 115 that is not doped with impurities is formed between the source region 113 and the drain region 114.

A gate insulating layer 116 is formed on the semiconductor active layer 112. The gate insulation layer 116 is a single layer or a layer stack including an inorganic material such as a silicon oxide, a silicon nitride, or a metal oxide.

A gate electrode 117 is formed on the gate insulating layer 116. The gate electrode 117 may be a single layer or a layer stack including gold (Au), silver (Ag), copper (Cu), nickel (Ni), platinum (Pt), palladium (Pd), aluminum (Al), molybdenum (Mo), chrome (Cr), etc. or it may include an alloy such as Al:Nd, Mo:W, etc.

An interlayer insulating layer 118 is formed on the gate electrode 117. The interlayer insulation layer 118 includes an inorganic layer formed of silicon oxide or silicon nitride. The interlayer insulation layer 118 may include an organic layer.

A source electrode 119 and a drain electrode 121 are formed on the interlayer insulating layer 119. Contact holes 122 are formed in the gate insulation layer 116 and the interlayer insulation layer 118 by selectively removing parts of the gate insulation layer 116 and the interlayer insulation layer 118. The source electrode 119 is electrically connected to the source region 113, and the drain electrode 121 is electrically connected to the drain region 114 through the contact holes 122.

The source electrode 119 and the drain electrode 121 may include the same material as the material used to form the gate electrode 117. A protection layer 123 (passivation layer and/or planarization layer) is formed on the source electrode 119 and the drain electrode 121 in order to prevent the source electrode 119 and the drain electrode 121 from being eroded due to moisture and oxygen.

The protection layer 123 protects and planarizes a thin film transistor (TFT) located therebelow. The protection layer 123 may be formed in various forms, and may be formed of an organic material, such as benzocyclobutene (BCB) or acryl, or an inorganic material such as SiNx. The protection layer 123 may have a single layer or multilayer structure.

An OLED is formed on the TFT. To form the OLED, a first electrode 125 corresponding to a pixel electrode is electrically connected through a contact hole 124 to one of the source electrode 119 and the drain electrode 121.

The first electrode 125 may serve as an anode from among electrodes included in the OLED, and may be formed of any of various conductive materials. The first electrode 125 may be formed as a transparent electrode or as a reflective electrode according to its purpose.

For example, when the first electrode 125 is formed as the transparent electrode, the first electrode 125 may be formed of indium tin oxide (ITO), indium zinc oxide (IZO), zinc oxide (ZnO), or indium oxide (In$_2$O$_3$). When the first electrode 125 is formed as the reflective electrode, the first electrode 125 may be formed by forming a reflective layer of silver (Ag), magnesium (Mg), aluminum (Al), platinum (Pt), palladium (Pd), gold (Au), nickel (Ni), neodymium (Nd), iridium (Ir), chromium (Cr) or a compound thereof, and depositing ITO, IZO, ZnO, or In$_2$O$_3$ on the reflective layer.

A pixel defining layer (PDL) 126 is formed on the protection layer 123 so as to cover an edge of the first electrode 125 of the OLED. The PDL 126 defines an emissive area of each sub pixel by surrounding the edge of the first electrode 125.

The PDL 126 may be formed of an organic material or an inorganic material.

For example, the PDL 126 may be formed of an organic material, such as polyimide, polyamide, BCB, acrylic resin, phenol resin, etc., or of an inorganic material, such as SiNx. The PDL 126 may be modified in various ways such as having a single layer or a layer stack.

An intermediate layer 127 is formed on the first electrode 125 that is exposed by etching a part of the PDL 126. The intermediate layer 127 may be formed by deposition.

In the present embodiment, the intermediate layer 127 is patterned in correspondence to each sub pixel, i.e., the first electrode 125 that is patterned. However, this is for convenience of description of a structure of the sub pixel, and various embodiments may be possible.

The intermediate layer 127 may be formed of a low-molecular organic material or polymer organic material.

For example, the intermediate layer 127 includes an organic emission layer and may further include at least one of a hole injection layer (HIL), a hole transport layer (HTL), an electron transport layer (ETL), and an electron injection layer (EIL). However, the present embodiment is not limited thereto, and the intermediate layer 127 includes the organic emission layer and may further include other various functional layers.

A second electrode 128 corresponding to a common electrode of the OLED is formed on the intermediate layer 127. The second electrode 128 may be formed as a transparent electrode or as a reflective electrode, as in the case of the first electrode 125.

The first electrode 125 and the second electrode 128 are insulated from each other by the intermediate layer 127. If voltages are applied to the first electrode 125 and the second electrode 128, visible light is emitted in the intermediate layer 127, and thus an image recognizable by a user is formed.

The second electrode 128 may be formed as a transparent electrode or as a reflective electrode, as in the case of the first electrode 125.

When the second electrode 128 is used as the transparent electrode, the second electrode 128 may be formed by depositing a metal having a low work function, i.e., lithium (Li), calcium (Ca), lithium fluoride/calcium (LiF/Ca), lithium fluoride/aluminum (LiF/Al), aluminum (Al), magnesium (Mg), or a compound thereof, on the intermediate layer 127, and by further forming an auxiliary electrode formed of a transparent electrode material, such as ITO, IZO, ZnO, In$_2$O$_3$, or the like on the metal and the compound.

When the second electrode layer 128 is used as the reflective electrode, the second electrode 128 may be formed by depositing Li, Ca, LiF/Ca, LiF/Al, Al, Mg, or a compound thereof on the intermediate layer 127.

When the first electrode 125 is formed as the transparent electrode or the reflective electrode, the first electrode 125 may be formed in a shape corresponding to an opening of each sub pixel. The second electrode 128 may be formed by depositing the transparent electrode or the reflective electrode on the overall display area.

Alternatively, the second electrode 128 may be formed in various patterns, instead of being formed on the entire display area. The first electrode 125 and the second electrode 128 may be stacked in opposite positions.

The circuit area CA may include various circuit patterns, such as a power supply pattern, an antistatic pattern, etc.

For example, a circuit wiring 129 is formed in the circuit area CA. The circuit wiring 129 may be formed on the protection layer 123. The circuit wiring 129 may be formed of the same material as that of the first electrode 125.

The circuit wiring 129 is connected to a power wiring 130. The power wiring 130 may be formed on the interlayer insulating layer 118. The power wiring 130 may be formed of the same material as that of the source electrode 119 or the drain electrode 121.

The second electrode 128 may be electrically connected to the circuit wiring 129 and the power wiring 130.

The sealing portion 200 is formed in the cell seal area CSA. The sealing portion 200 is formed between the substrate 110 and the encapsulation portion 140. The sealing portion 200 is formed in the cell seal area CSA along an edge of the display panel 160. The sealing portion 200 is formed in a consecutive line to protect the display unit 120. The sealing portion 200 seals the substrate 110 and the encapsulation portion 140 to each other. The sealing portion 200 includes a glass frit.

The encapsulation portion 140 is coupled to the substrate 110. The encapsulation portion 140 is formed to protect the OLED and other thin films from external moisture or oxygen.

The encapsulation portion 140 may be a glass substrate having rigidity, a polymer resin substrate, or a flexible film. The encapsulation portion 140 may be formed on the OLED by alternately stacking an organic layer and an inorganic layer. In this regard, a plurality of organic layers and a plurality of inorganic layers may be stacked.

A touch screen panel wiring 159 is formed on the encapsulation portion 140 and is electrically connected to the first and second electrode pattern portions 151 and 152, respectively, included in the touch screen panel 150 of FIG. 3.

The touch screen panel wiring 159 is disposed in the display panel 160 in correspondence to the circuit area CA. In the circuit area CA, the touch screen panel wiring 159 is patterned on an outer surface of the encapsulation portion 140 in a direction perpendicular to a direction in which the display panel 160 is disposed.

The alignment key 260 is formed on the encapsulation portion 140.

The alignment key 260 is disposed in the display panel 160 in correspondence to the cell seal area CSA. In the cell seal area CSA, the alignment key 260 is patterned on the outer surface of the encapsulation portion 140 in the direction perpendicular to the direction in which the display panel 160 is disposed.

The alignment key 260 may be formed on the same surface as that of the encapsulation portion 140 on which the touch screen panel wiring 159 is formed. The alignment key 260 is formed of the same material as that of the touch screen panel wiring 159, for example, a conductive material such as molybdenum (Mo). The alignment key 260 may be formed during the same process as that of the touch screen panel wiring 159.

The display device 100 having the above-described structure may align the display panel 160 and the window cover 180 of FIG. 2 at a right position by using the alignment key 260 to couple the display panel 160 and the window cover 180 to each other.

The display device 100 radiates laser beams onto the sealing portion 200 disposed between the substrate 110 and the encapsulation portion 140 by using a laser radiation apparatus and firmly couples the substrate 110 and the encapsulation portion 140 to each other due to melting of the sealing portion 200.

In this regard, laser beams are reflected from the alignment key 260 formed of a metallic material so that a part of the laser beams does not pass through the encapsulation portion 140. Thus, a phenomenon occurs in that a sealed temperature profile is distorted in an area of the sealing portion 200 in a position corresponding to the alignment key 260.

Therefore, if the sealing portion 200 is observed after being manufactured, the strength of the sealing portion 200 deteriorates.

According to the present embodiment, an area expansion portion is formed in the position corresponding to the alignment key 260.

This will be described in more detail below.

Figure 5:
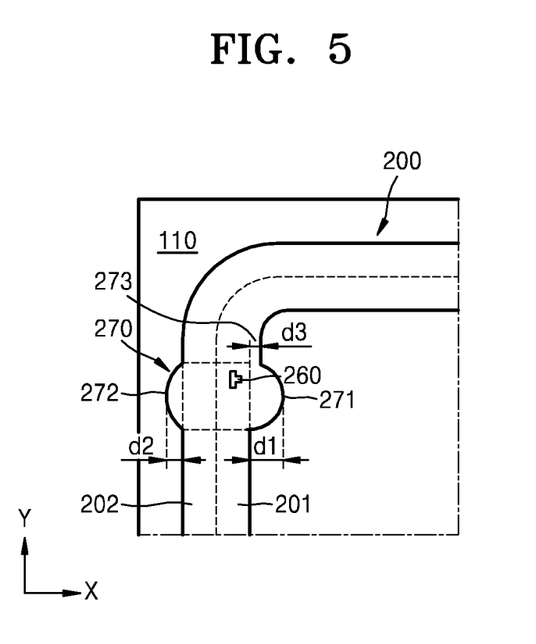
FIG. 5 is a plan view of a sealing portion of FIG. 4.

FIG. 5 is a plan view of the sealing portion of FIG. 4.

Referring to FIG. 5, the sealing portion 200 overlaps with the alignment key 260 of FIG. 4 in a vertical direction of the display panel 160. The sealing portion 200 is formed along an edge of the display panel 160, i.e. the cell seal area CSA of FIG. 4, in a consecutive line. The alignment key 260 is formed in corners of the display panel 160. In the present embodiment, the display panel 160 has a rectangular shape, and thus the alignment key 260 is formed in each of the corners of the display panel 160.

The area expansion portion 270 of FIG. 5 that expands an area of the sealing portion 200 and is formed in a part where the alignment key 260 is disposed in a direction perpendicular to a direction in which the display panel 160 of FIG. 4 is disposed.

In the present embodiment, the area expansion portion 270 of FIG. 5 is formed in each of the corners of the display panel 160. The area expansion portion 270 is formed by expanding a width of the sealing portion 200 in a part where the alignment key 260 is disposed greater than a width of the sealing portion 200 in another part.

In more detail, the sealing portion 200 includes a first portion 201 and a second portion 202 that is integrally formed with the first portion 201 and extends in a width direction (X direction). The first portion 201 and the second portion 202 are lines extending in a length direction (Y direction).

When the sealing portion 200 is divided in half in the width direction (X direction), the first portion 201 corresponds to an area from a dotted line at a center of the sealing portion 200 of FIG. 5 to a right edge, and the second portion 202 corresponds to an area from the dotted line at the center to a left edge.

The first portion 201 is an area adjacent to the active area AA of the display unit 120 of FIG. 4. The second portion 202 is an area adjacent to the outside of the display panel 160 of FIG. 4.

The first portion 201 and the second portion 202 are integrally formed as the sealing portion 200 in a single consecutive line. The first portion 201 and the second portion 202 extend in a single line in the length direction (Y direction) of the display panel 160.

The alignment key 260 is disposed on the first portion 201. Alternatively, the alignment key 260 may be disposed on the second portion 202.

The area expansion portion 270 includes a first area expansion portion 271 that protrudes from an outer edge of the first portion 201 toward the active area AA of the display unit 120 and a second area expansion portion 272 that protrudes from an outer edge of the second portion 202 toward an edge of the display panel 160.

The first area expansion portion 271 integrally extends from the first portion 201. The second area expansion portion 272 integrally extends from the second portion 202.

Each of the first area expansion portion 271 and the second area expansion portion 272 is formed so as to have a curve. In the present embodiment, the first area expansion portion 271 and the second area expansion portion 272 are semicircular in shape and may be formed in other shapes.

In this regard, the first area expansion portion 271 and the second area expansion portion 272 are asymmetrically formed in both edges in the width direction (X direction) of the sealing portion 200 in the part where the alignment key 260 is disposed.

In the present embodiment, the alignment key 260 is disposed on the first portion 201, and thus a distance d1 of the first area expansion portion 271 is greater than a distance d2 of the second area expansion portion 272.

The reason why the distance d1 of the first area expansion portion 271 is greater than the distance d2 of the second area expansion portion 272 is as follows.

By forming the alignment key 260, the first portion 271, provided in the part where the alignment key 260 is disposed contracts more frequently than the second portion 272 after laser sealing.

Therefore, a contraction amount of the first portion 271 provided in the part where the alignment key 260 is disposed is compensated for by relatively expanding an area of the first area expansion portion 271 so as to be greater than an area of the second area expansion portion 272.

In addition, a contraction amount of the sealing portion 200 in the part where the alignment key 260 is disposed after laser sealing is relatively greater than that of the sealing portion 200 in another part where the alignment key 260 is not disposed.

That is, by forming the alignment key 260, desired thermal energy is not applied to the sealing portion 200, and thus the contraction amount of the sealing portion 200 in the part where the alignment key 260 is disposed further increases during hardening. Accordingly, sizes of the first area expansion portion 271 and the second area expansion portion 272 may correspond to a size of a contraction area of the sealing portion 200.

Although the sealing portion 200 in the part where the alignment key 260 is disposed contracts more frequently after laser sealing as described above, the sealing portion 200 in the part where the alignment key 260 is disposed has substantially the same width as that of the sealing portion 200 in the part where the alignment key 260 is not disposed due to the area expansion portion 200 having a corresponding size for compensating for the contraction amount.

In the meantime, an area of the sealing portion 200 formed in a part corresponding to corners of the display panel 160 may further increase.

In the corners of the display panel 160, the sealing portion 200 extends by changing a path at an angle of about 90°. In doing so, a third area expansion portion 273 for reinforcing a thickness is formed in the sealing portion 200 in a part where the path is changed.

The third area expansion portion 273 extends from an edge of the first portion 201 corresponding to the part where the sealing portion 200 changes the path to the active area AA of the display unit 120. As described above, a bending part of the sealing portion 200 increases by a distance d3 of the third area expansion portion 273.

As described above, according to the one or more of the above embodiments of the present invention, a display device forms an area expansion portion in a sealing portion at a position corresponding to an alignment key, thereby enhancing structural strength. Accordingly, reliability of the sealing portion increases.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and detail may be made therein without departing from the spirit and scope of the present invention as defined by the following claims.

What is claimed is:

1. A display device, comprising:
    a display panel including a substrate on which a display unit is formed and an encapsulation unit for scaling the substrate;
    a touch screen panel formed on the encapsulation unit;
    a window cover provided on the touch screen panel;
    an alignment key for aligning positions of the display panel and the window cover; and
    a sealing portion disposed between the substrate and the encapsulation unit;
    wherein an area expansion portion is formed in a part of the sealing portion corresponding to the alignment key,
    wherein the sealing portion comprises a first portion extending from a position adjacent to the display unit in a direction of the display panel, and a second portion extending from the first portion in a width direction thereof and extending from an exterior of the display panel in a direction of the display panel;
    wherein the alignment key is provided on the first portion;
    wherein the area expansion portion comprises a first area expansion portion protruding from the first portion and a second area expansion portion protruding from the second portion; and
    wherein the first area expansion portion and the second area expansion portion have different sizes.

2. The display device of claim 1, wherein the first portion and the second portion are integrally formed as one line.

3. The display device of claim 1, wherein an area of the first area expansion portion is greater than an area of the second area expansion portion.

4. The display device of claim 1, wherein the first area expansion portion and the second area expansion portion are semicircles.

5. The display device of claim 1, wherein the sealing portion is a consecutive line formed along edges of the display panel.

6. A display device, comprising:
    a display panel including a substrate on which a display unit is formed and an encapsulation unit for sealing the substrate;
    a touch screen panel formed on the encapsulation unit;
    a window cover provided on the touch screen panel;
    an alignment key for aligning positions of the display panel and the window cover; and
    a sealing portion disposed between the substrate and the encapsulation unit;
    wherein an area expansion portion is formed in a part of the sealing portion corresponding to the alignment key,
    wherein the touch screen panel comprises a plurality of electrode pattern units formed on the encapsulation unit and at least one insulating layer that separates the plurality of electrode pattern units from each other; and
    wherein the alignment key is formed on a same surface as a surface of the encapsulation unit in which a touch screen panel wiring electrically connected to the plurality of electrode pattern units is formed.

7. The display device of claim 6, wherein the substrate comprises an active region in which the display unit is formed, a circuit region extending to an outside of the active region, and a sealing region extending to an outside of the circuit region and in which the sealing portion is formed;
    wherein the touch screen panel wiring is formed on the encapsulation unit in correspondence to the circuit region; and
    wherein the alignment key is formed on the encapsulation unit in correspondence to the sealing region.

8. The display device of claim 6, wherein the sealing portion comprises a glass fit.

9. A display device, comprising:
- a display panel including a substrate on which a display unit is formed and an encapsulation unit for sealing the substrate;
- a touch screen panel formed on the encapsulation unit;
- a window cover provided on the touch screen panel;
- an alignment key for aligning positions of the display panel and the window cover; and
- a sealing portion disposed between the substrate and the encapsulation unit, wherein the sealing portion is formed along an edge of the display panel in a consecutive line including glass frit;
- wherein an area expansion portion is formed in a part of the sealing portion corresponding to the alignment key.

10. The display device of claim 9, wherein the alignment key is formed on a part of the encapsulation unit corresponding to the sealing portion in a direction perpendicular to a direction in which the display panel is disposed.

11. The display device of claim 10, wherein the sealing portion and the alignment key overlap with each other, and wherein the area expansion portion is formed by expanding an area of the sealing portion in a portion that overlaps with the alignment key.

12. The display device of claim 11, wherein the area expansion portion is formed by expanding a width of the sealing portion in the portion that overlaps with the alignment key so as to be greater than a width of the sealing portion in another portion that does not overlap with the alignment key.

13. The display device of claim 11, wherein the area expansion portion is formed so as to have a size corresponding to a contraction area of the sealing portion in the portion that overlaps with the alignment key after performing laser sealing.

14. The display device of claim 11, wherein the sealing portion extends in a direction of the display panel; and
- wherein area expansion portions extend from both edges of the sealing portion in a width direction of the sealing portion in the portion that overlaps with the alignment key.

15. The display device of claim 14, wherein the area expansion portions formed in both edges of the sealing portion are asymmetrical with respect to each other.

16. The display device of claim 11, wherein the area expansion portion is integrally formed with the sealing portion.

17. The display device of claim 5, wherein the sealing portion extends by changing a path in corner portions of the display panel, and an area of the sealing portion further expands in the corner portions.

18. The display device of claim 5, wherein a plurality of the alignment keys and a plurality of the area expansion portions are formed in corners of the display panel.

19. The display device of claim 9, wherein the alignment key formed of a conductive material.

20. The display device of claim 9, wherein the display unit comprises:
- a thin film transistor (TFT); and
- an organic light-emitting diode (OLED) electrically connected to the TFT, and including an intermediate layer comprising a first electrode, a second electrode, and an emissive layer formed between the first electrode and the second electrode.

* * * * *